(12) United States Patent
Thoumazet et al.

(10) Patent No.: US 8,766,280 B2
(45) Date of Patent: Jul. 1, 2014

(54) PROTECTIVE SUBSTRATE FOR A DEVICE THAT COLLECTS OR EMITS RADIATION

(75) Inventors: Claire Thoumazet, Paris (FR); Emmanuel Valentin, Le Plessis Trevise (FR); Stephanie Roche, Paris (FR)

(73) Assignee: Saint-Gobain Performance Plastics Corporation, Aurora, OH (US)

( * ) Notice: Subject to any disclaimer, the term of this patent is extended or adjusted under 35 U.S.C. 154(b) by 32 days.

(21) Appl. No.: 13/395,406

(22) PCT Filed: Sep. 3, 2010

(86) PCT No.: PCT/EP2010/062998
§ 371 (c)(1),
(2), (4) Date: May 29, 2012

(87) PCT Pub. No.: WO2011/029786
PCT Pub. Date: Mar. 17, 2011

(65) Prior Publication Data
US 2012/0228641 A1   Sep. 13, 2012

Related U.S. Application Data

(60) Provisional application No. 61/254,932, filed on Oct. 26, 2009.

(30) Foreign Application Priority Data

Sep. 10, 2009   (FR) ...................... 09 56206

(51) Int. Cl.
| | |
|---|---|
| *H01L 27/15* | (2006.01) |
| *H01L 31/12* | (2006.01) |
| *H01L 33/00* | (2010.01) |
| *H01L 27/14* | (2006.01) |
| *H01L 31/00* | (2006.01) |
| *H01L 21/00* | (2006.01) |
| *H01L 21/8238* | (2006.01) |
| *C23C 14/00* | (2006.01) |
| *C23C 14/32* | (2006.01) |
| *H01L 51/50* | (2006.01) |
| *H01L 51/52* | (2006.01) |
| *G02F 1/35* | (2006.01) |

(52) U.S. Cl.
CPC ......... *H01L 51/5004* (2013.01); *H01L 51/5253* (2013.01); *G02F 1/353* (2013.01)
USPC   257/79; 257/431; 257/E31.119; 257/E33.06; 438/29; 438/218; 204/192.1

(58) Field of Classification Search
CPC .. H01L 51/5004; H01L 51/5253; G02F 1/353
USPC .................. 257/79, 431, E31.119, E33.06; 438/218, 29, 30; 204/192.1; 428/218
See application file for complete search history.

(56) References Cited

U.S. PATENT DOCUMENTS 5,172,269 A * 12/1992 Ogura et al. .................. 359/580
5,234,748 A *  8/1993 Demiryont et al. ........... 428/216

(Continued)

FOREIGN PATENT DOCUMENTS

| CN | 102714279 A | 10/2012 |
|---|---|---|
| CN | 102714280 A | 10/2012 |

(Continued)

OTHER PUBLICATIONS

Jin-Seong Park et al., "Thin film encapsulation for flexible AM-OLeD: a revew," Semiconductor Science and Technology, vol. 26, No. 3, Mar. 1, 2011, p. 034001, XP55006840.

(Continued)

*Primary Examiner* — David S Blum
(74) *Attorney, Agent, or Firm* — Abel Law Group, LLP; Chi Suk Kim

(57) ABSTRACT

This substrate (11) for a device (50) that collects or emits radiation comprises a transparent polymer layer (1) and a barrier layer (2) on at least one face (1A) of the polymer layer. The barrier layer (2) consists of an antireflection multilayer of at least two thin transparent layers (21, 22, 23, 24) having both alternately lower and higher refractive indices and alternately lower and higher densities, wherein each thin layer (21, 22, 23, 24) of the constituent multilayer of the barrier layer (2) is an oxide, nitride or oxynitride layer.

13 Claims, 2 Drawing Sheets

(56) References Cited

U.S. PATENT DOCUMENTS

| | | | | |
|---|---|---|---|---|
| 5,254,904 | A | * | 10/1993 | Van De Leest et al. ........ 313/479 |
| 5,853,478 | A | * | 12/1998 | Yonehara et al. ............... 117/89 |
| 6,068,914 | A | * | 5/2000 | Boire et al. .................... 428/216 |
| 6,284,382 | B1 | * | 9/2001 | Ishikawa et al. .............. 428/428 |
| 6,574,039 | B1 | | 6/2003 | Murata et al. .................. 359/359 |
| 6,589,658 | B1 | * | 7/2003 | Stachowiak .................. 428/432 |
| 6,842,288 | B1 | * | 1/2005 | Liu et al. ....................... 359/586 |
| 7,504,332 | B2 | | 3/2009 | Won et al. |
| 2002/0090521 | A1 | * | 7/2002 | Nakajima et al. ............. 428/446 |
| 2003/0067266 | A1 | | 4/2003 | Kim et al. |
| 2003/0104753 | A1 | | 6/2003 | Graff et al. |
| 2003/0186064 | A1 | | 10/2003 | Murata et al. |
| 2004/0018362 | A1 | * | 1/2004 | Nakajima et al. ............. 428/428 |
| 2004/0076835 | A1 | * | 4/2004 | Watanabe ...................... 428/432 |
| 2004/0160178 | A1 | | 8/2004 | Qiu et al. |
| 2004/0229394 | A1 | | 11/2004 | Yamada et al. |
| 2005/0207016 | A1 | * | 9/2005 | Ando ............................. 359/586 |
| 2007/0116966 | A1 | * | 5/2007 | Mellott et al. ................. 428/432 |
| 2007/0155137 | A1 | * | 7/2007 | Joshi et al. .................... 438/478 |
| 2007/0212498 | A1 | * | 9/2007 | Fukushige et al. ............ 428/1.31 |
| 2008/0138539 | A1 | | 6/2008 | Breitung et al. |
| 2008/0213513 | A1 | * | 9/2008 | Kameshima et al. ......... 428/1.32 |
| 2008/0265245 | A1 | * | 10/2008 | Gotoh et al. ................... 257/40 |
| 2009/0072230 | A1 | | 3/2009 | Ito et al. |
| 2009/0084963 | A1 | * | 4/2009 | Kost ......................... 250/370.01 |
| 2009/0087668 | A1 | * | 4/2009 | Noro et al. .................... 428/421 |
| 2009/0095346 | A1 | | 4/2009 | Hurley et al. |
| 2009/0096106 | A1 | | 4/2009 | Vrtis et al. |
| 2009/0110896 | A1 | * | 4/2009 | Kuramachi et al. ........... 428/220 |
| 2009/0128916 | A1 | * | 5/2009 | Noro ............................. 359/601 |
| 2009/0199901 | A1 | | 8/2009 | Trassl et al. |
| 2009/0305062 | A1 | * | 12/2009 | Choi et al. .................... 428/447 |
| 2010/0089636 | A1 | | 4/2010 | Ramadas et al. |
| 2010/0215929 | A1 | | 8/2010 | Seo et al. |
| 2010/0330748 | A1 | | 12/2010 | Chu et al. |
| 2011/0085233 | A1 | * | 4/2011 | Furusato ....................... 359/359 |
| 2012/0228668 | A1 | | 9/2012 | Thoumazet et al. |
| 2012/0258294 | A1 | | 10/2012 | Leyder et al. |
| 2012/0258295 | A1 | | 10/2012 | Leyder et al. |

FOREIGN PATENT DOCUMENTS

| | | |
|---|---|---|
| DE | 10 2008 031405 A1 | 1/2010 |
| EP | 0502790 B1 | 12/1994 |
| EP | 1 329 307 A1 | 7/2003 |
| EP | 1892777 A2 | 2/2008 |
| EP | 2476147 A1 | 7/2012 |
| EP | 2476148 A1 | 7/2012 |
| FR | 2 858 975 A1 | 2/2005 |
| FR | 2 949 775 A1 | 3/2011 |
| FR | 2 949 776 A1 | 3/2011 |
| JP | 2000211053 A | 8/2000 |
| JP | 2004198590 A | 7/2004 |
| JP | 2006338947 A | 12/2006 |
| JP | 2007038529 A | 2/2007 |
| JP | 2007277631 A | 10/2007 |
| JP | 2009073090 A | 4/2009 |
| JP | 2009090634 A | 4/2009 |
| JP | 2009117817 A | 5/2009 |
| MX | 2012002892 A | 6/2012 |
| WO | 0137006 A1 | 5/2001 |
| WO | 2005045948 A2 | 5/2005 |
| WO | 2005081333 A2 | 9/2005 |
| WO | 2008054542 A2 | 5/2008 |
| WO | 2009098793 A1 | 8/2009 |
| WO | 2010108894 A1 | 9/2010 |
| WO | 2011029786 A1 | 3/2011 |
| WO | 2011029787 A1 | 3/2011 |
| WO | 2012139056 A2 | 10/2012 |
| WO | 2012139057 A2 | 10/2012 |

OTHER PUBLICATIONS

Zhengxia Chen et al., "Molecular dynamics simulation of water diffusion inside an amorphous polyacrylate latex film," Journal of Polymer Science, Part B: Polymer Phsics, vol. 45, No. 8, Apr. 15, 2007, pp. 884-891, XP55010766.

E. H. H. Jamieson et al., "Structure and oxygen-barrier properties of metallized polymer film," Journal of Materials Science, vol. 18, No. 1, Jan. 1, 1983, pp. 64-80, XP55010762.

Myeon-Cheon Choi et al., "Polymers for flexible displays: From material selection to device applications," Progress in Polymer Science, vol. 33, Feb. 4, 2008, pp. 581-630, XP002609297.

Kuo M. L., et al., "Realization of a near-perfect anitreflection coating for silicon solar energy utilization," Optics Letters, vol. 33, No. 21, Nov. 1, 2008, pp. 2527-2529, XP002578609.

H. Lifka, et al., "50.3: Thin Film Encapuslation of Oled Displays with a NONON Stack," Philips Research Laboratories Eindhoven, Slo 04 Digest, pp. 1384-1387, 2004.

International Search Report from Application No. PCT/EP2010/062998, dated Nov. 23, 2010, 5 pgs.

U.S. Appl. No. 13/441,766, filed Apr. 6, 2012, Inventors: Charles Leyder et al.

International Search Report from Application No. PCT/EP2010/062999, dated Nov. 30, 2010, 4 pgs.

U.S. Appl. No. 13/395,412, filed Mar. 9, 2012, Inventors: Claire Thoumazet et al.

French Search Report from Application No. 1153114, dated Oct. 31, 2011, 8 pgs.

French Search Report from Application No. 1153113, dated Oct. 31, 2011, 8 pgs.

U.S Appl. No. 13/441,760, filed Apr. 6, 2012, Inventors: Charles Leyder et al.

C. Ricciardi, et al., "Amorphous Silicon Nitride: a suitable alloy for optical multilayered structures," Journal of Non-crystalline Solids, vol. 3.52, Mar. 31, 2006, pp. 1294-1297, XP002577247.

R. Vernhes et al., "Pulsed Radio Frequency Plasma Deposition of a-SiNx:H Alloys: Film Applications," Journal of Applied Physics, Americal Institute of Physics, New York, US LNKD-DOI:10.1063/1.2349565, vol. 100, No. 6, Sep. 28, 2006, XP012090005.

R. Vernhes et al. "Single-Material Inhomogeneous Optical Filters Based on Microstructural Gradients in Plasma-Deposited Deposited Silicon Nitride," Applied Opitcs, vol. 43, No. 1, Jan. 1, 2004, pp. 97-103, XP002577246.

W. Wolke et al., "Sin:H Anti-Reflection Coatings for C-XI Solar Cells by Large Scale Inline Sputtering," Proceedings of the Eurpopean Photovoltaic Solar Energy Conference, Jun. 1, 2004, pp. 419-422, XP008078903.

The International Search Report for International Application No. PCT/US2012/032616 received from the International Searching Authority (ISA/KR), dated Nov. 30, 2012, 1 page.

The International Search Report for International Application No. PCT/US2012/032618 received from the International Searching Authority (ISA/KR), dated Nov. 28, 2012, 1 page.

* cited by examiner

PROTECTIVE SUBSTRATE FOR A DEVICE THAT COLLECTS OR EMITS RADIATION

CROSS-REFERENCE TO RELATED APPLICATION

This application claims priority under 35 U.S.C. §119(a)-(d) to French Application No. 0956206, entitled "Protective Substrate for a Device that Collects or Emits Radiation", by Thoumazet et al., filed Sep. 10, 2009, which is assigned to the current assignee hereof and incorporated herein by reference in its entirety. This application further claims priority under 35 U.S.C. §119(e) to U.S. Patent Application No. 61/254,932 entitled "Protective Substrate for a Device that Collects or Emits Radiation," by Thoumazet et al., filed Oct. 26, 2009, which is assigned to the current assignee hereof and incorporated herein by reference in its entirety.

FIELD OF THE DISCLOSURE

The present invention relates to a protective substrate for a device that collects or emits radiation. The invention also relates to a radiation-collecting or radiation-emitting device comprising such a substrate, and also to a process for manufacturing such a substrate.

BACKGROUND

A radiation-collecting device is typically a photovoltaic module comprising at least one photovoltaic cell suitable for collecting and converting the energy from radiation into electrical energy. A radiation-emitting device is typically an OLED device comprising at least one organic light-emitting diode, or OLED, suitable for converting electrical energy into radiation.

In a known manner, the energy conversion elements of a device that collects or emits radiation, namely the photovoltaic cells in the case of a photovoltaic module or the OLED structures in the case of an OLED device, comprise a material suitable for providing the energy conversion and two electrically conductive contacts on both sides of this material. However, regardless of their manufacturing technology, such energy conversion elements are susceptible to degradation under the effect of environmental conditions, in particular under the effect of exposure to air or to moisture. By way of example, for OLED structures or organic photovoltaic cells, the front electrode and the organic material are particularly sensitive to environmental conditions. For thin-film photovoltaic cells comprising an inorganic absorber layer, the front electrode of the cell, formed based on a transparent conductive oxide (or TCO) layer or based on a transparent conductive coating (or TCC), is also very sensitive to environmental conditions.

In order to protect the energy conversion elements of a device that collects or emits radiation with respect to degradations due to exposure to air or to moisture, it is known to manufacture the device with a laminated structure, in which the energy conversion elements are encapsulated and combined at least with one transparent front substrate. This front substrate is placed on the side on which radiation is incident on the device in the case of a photovoltaic module, or on the side on which radiation is extracted from the device in the case of an OLED device.

Depending on the application of the device, it may be desirable to combine the energy conversion elements with a light flexible substrate, rather than a glass substrate. Such a light flexible substrate is typically a substrate composed of a transparent thermoplastic polymer, for example made of polyethylene, polyester, polyamide, polyimide, polycarbonate, polyurethane, polymethyl methacrylate or a fluoropolymer. It has however been observed that when a radiation-collecting or radiation-emitting device comprises a polymer front substrate, the device exhibits a high degree of degradation. This is because a polymer substrate, which has a high permeability, is not able to prevent the migration of contaminants such as water vapor or oxygen to the energy conversion elements.

US-A-2004229394 describes a protective front substrate for a photovoltaic module that comprises a polymer film and a barrier layer deposited on the face of the polymer film intended to be facing the inside of the module. This barrier layer makes it possible to limit the migration of gases from the polymer film to the photovoltaic cell. However, due to the presence of this barrier layer, the transmission of radiation to the photovoltaic cell is capable of being degraded, hence there is a risk of reducing the photovoltaic efficiency of the photovoltaic module.

It is these drawbacks that the invention intends more particularly to remedy by proposing a protective substrate which, when it is integrated into a device that collects or emits radiation, gives this device improved resistance, especially to air and to moisture, by providing an effective and very long-term protection of the energy conversion elements of the device that are sensitive to air and/or moisture, while preserving the energy conversion efficiency of the device, or even increasing this efficiency.

SUMMARY

For this purpose, one subject of the invention is a protective substrate for a device comprising at least one element that collects or emits radiation, this substrate comprising a transparent polymer layer and a barrier layer on at least one face of the polymer layer, characterized in that the or each barrier layer consists of an antireflection multilayer of at least two thin transparent layers having both alternately lower and higher refractive indices and alternately lower and higher densities, each thin layer of the constituent multilayer of the or each barrier layer being an oxide, nitride or oxynitride layer.

Within the meaning of the invention, a transparent layer is a layer that is transparent at least in the wavelength ranges of use for, or emitted by, the radiation-collecting or radiation-emitting elements of the device into which the substrate according to the invention is intended to be integrated as a front substrate. By way of example, in the case of a photovoltaic module comprising photovoltaic cells based on polycrystalline silicon, each transparent layer is advantageously transparent in the wavelength range between 400 nm and 1200 nm, which are the wavelengths of use for this type of cell.

Furthermore, within the meaning of the invention, an antireflection multilayer is a multilayer that ensures a transmission of radiation through the protective substrate, to or from the element that collects or emits radiation, which is greater than or equal to the transmission of radiation obtained in the absence of the antireflection multilayer. Within the context of the invention, the expression "thin layer" is also understood to mean a layer having a thickness of less than 1 micrometer.

According to other advantageous features of a protective substrate according to the invention, taken in isolation or according to all technically possible combinations:

the or each barrier layer comprises, at the interface between
a first layer and a second layer of each pair of successive thin layers of its constituent multilayer, a junction zone having a density gradient between the density of the first layer and the density of the second layer;

the difference between the density of a higher density layer and the density of a lower density layer of each pair of successive thin layers of the constituent multilayer of the or each barrier layer is greater than or equal to 10% of the density of the lower density layer;

the geometric thickness of each thin layer of the constituent multilayer of the or each barrier layer is adapted in order to maximize the transmission of radiation through the substrate to or from the element that collects or emits radiation;

the substrate comprises a barrier layer on the face of the polymer layer intended to be facing the element that collects or emits radiation and/or a barrier layer on the face of the polymer layer intended to be facing the other way from the element that collects or emits radiation;

for each pair of successive thin layers of the constituent multilayer of the or each barrier layer, the two successive thin layers are of the same chemical nature but have different stoichiometries;

the constituent multilayer of the or each barrier layer comprises at least the superposition of a thin hydrogenated silicon nitride layer having a refractive index between 1.8 and 1.9 at 550 nm and of a thin hydrogenated silicon nitride layer having a refractive index between 1.7 and 1.8 at 550 nm;

for each pair of successive thin layers of the constituent multilayer of the or each barrier layer, the two successive thin layers are of different chemical natures.

Another subject of the invention is a device that collects or emits radiation comprising a protective substrate as described above and at least one element that collects or emits radiation, the element being arranged relative to the substrate so as to be capable of collecting radiation that passes through the polymer layer and the or each barrier layer, or of emitting radiation through the polymer layer and the or each barrier layer.

In particular, the element that collects or emits radiation may be a photovoltaic cell or an organic light-emitting diode.

Another subject of the invention is a process for manufacturing a protective substrate as described above, in which at least some of the thin layers of the constituent multilayer of the or each barrier layer are deposited by plasma-enhanced chemical vapor deposition (PECVD), by sputtering, or combination thereof.

In particular, it is possible to deposit at least some of the thin layers of the constituent multilayer of the or each barrier layer by plasma-enhanced chemical vapor deposition by varying, during the deposition, the pressure in the deposition chamber, the power, the relative proportions of the precursors, the nature of the precursors, or any combination thereof.

It is also possible to deposit at least some of the thin layers of the constituent multilayer of the or each barrier layer by reactive sputtering, especially reactive magnetron sputtering, by varying, during the deposition, the pressure in the deposition chamber, the power, the nature of the reactive gas, or any combination thereof.

Advantageously, prior to the deposition of the thin layers of the constituent multilayer of the or each barrier layer on one corresponding face of the polymer layer, this face of the polymer layer is activated by means of a plasma, for example an $O_2$ or $H_2$ plasma.

BRIEF DESCRIPTION OF THE DRAWINGS

The features and advantages of the invention will appear in the following description of three exemplary embodiments of a protective substrate according to the invention, given solely by way of example and made with reference to the appended drawings in which.

DETAILED DESCRIPTION

In the whole of this description, the numerical values of refractive indices are given at 550 nm under illuminant D65, under the DIN 67507 standard.

Figure 1:
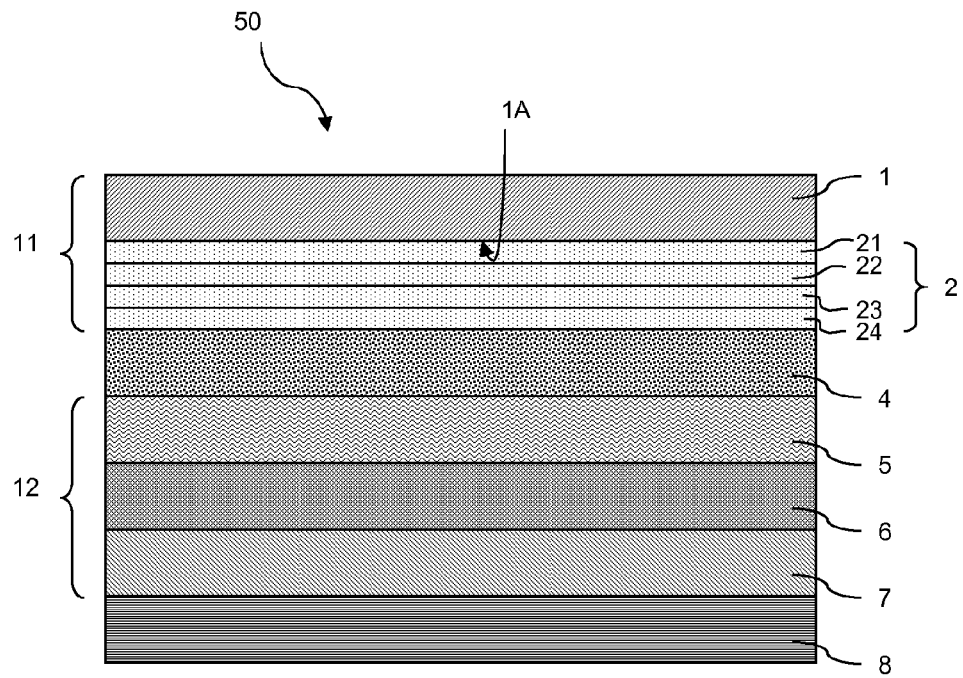
FIG. 1 is a schematic cross section of a photovoltaic solar module comprising a protective substrate conforming to a first exemplary embodiment of the invention.

The photovoltaic solar module 50 represented in FIG. 1 is a thin-film photovoltaic module, comprising a front substrate 11, or protective substrate, and a rear substrate 8 having a support function, between which a multilayer composed of layers 4, 5, 6, 7 is arranged.

The protective substrate 11, intended to be placed on the side on which solar radiation is incident on the module 50, comprises a film 1 having a geometric thickness of 200 micrometers made of transparent thermoplastic polymer, in particular, in this example, made of polyethylene terephthalate (PET), and a barrier layer 2 placed on the face 1A of the film 1 intended to be facing the inside of the module.

The rear substrate 8 is composed of any suitable, transparent or non-transparent, material, and bears, on its face facing the inside of the module 50, that is to say on the side on which solar radiation is incident on the module, an electrically conductive layer 7 that forms a rear electrode of the photovoltaic cell 12 of the module 50. By way of example, the layer 7 is based on molybdenum.

The layer 7 forming the rear electrode is surmounted, in a conventional manner, by a chalcopyrite compound absorber layer 6, in particular that comprises copper, indium and selenium, known as a CIS absorber layer, optionally with the addition of gallium (GIGS absorber layer), of aluminium or of sulphur, suitable for ensuring the conversion of solar energy to electrical energy. The absorber layer 6 is itself surmounted by a cadmium sulphide (CdS) layer, not represented in the figures, and optionally combined with an undoped intrinsic ZnO layer, also not represented, then by an electrically conductive layer 5 that forms a front electrode of the cell 12. The photovoltaic cell 12 of the module 50 is thus formed by the stack of layers 5, 6 and 7.

A polymer lamination interlayer 4 is positioned between the layer 5 that forms a front electrode and the protective substrate 11, so as to ensure that the functional layers of the module 50 are held between the front substrate 11 and the rear substrate 8. The lamination interlayer 4 is a thermosetting polymer layer, namely a layer of ethylene vinyl acetate (EVA) in this example. As a variant, the lamination interlayer 4 may be composed of polyvinyl butyral (PVB), or of any other material having suitable properties.

The layer 5 that forms the front electrode of the cell 12 is a layer based on aluminium-doped zinc oxide (AZO). As a variant and as non-limiting examples, the layer 5 may be a layer based on boron-doped zinc oxide, a layer based on another doped transparent conductive oxide (TCO), or a transparent conductive coating (TCC) such as a silver-based multilayer. In all these cases, the layer 5 that forms the front electrode is a layer that is sensitive to environmental conditions, the properties of which are susceptible to degradation under the effect of exposure to air or to moisture.

The barrier layer 2 of the protective substrate 11 makes it possible to protect the layer 5 with respect to environmental conditions, while guaranteeing a good transmission of radiation to the photovoltaic cell 12. Indeed, in accordance with the invention, this barrier layer 2 consists of an antireflection multilayer composed of four thin transparent layers 21, 22, 23, 24 of hydrogenated silicon nitride having both alternately lower and higher densities and alternately lower and higher refractive indices.

The difference between the density $d_{21}=d_{23}$ of the higher density layers 21 and 23 and the density $d_{22}=d_{24}$ of the lower density layers 22 and 24 is of the order of 10% of the density $d_{22}=d_{24}$ of the lower density layers 22 and 24. Since the layers 21 to 24 are of the same chemical nature $SiN_xH_y$, this difference in density is obtained by varying the stoichiometry, that is to say the values of x and/or y, between the denser layers and the less dense layers.

The presence of the lower density layers 22 and 24 makes it possible to relax the stresses at the denser layers 21 and 23, which limits the formation of defects within the barrier layer 2. Indeed, high densities are often accompanied by high mechanical stresses within the layer, which may be the cause of the appearance of cracks, which are favored paths for the diffusion of contaminants such as water vapor or oxygen.

In particular, a layer varying in density through the thickness is less liable to generate cracks and is consequently more effective in terms of protection against migration of contaminants, such as water vapor and oxygen, than a layer of the same thickness having the same or higher average density, but uniformly dense. The reason for this is that a succession of regions of different density interrupts the propagation of cracks. The diffusion paths, and consequently the diffusion times, are thus considerably lengthened.

Figure 3:
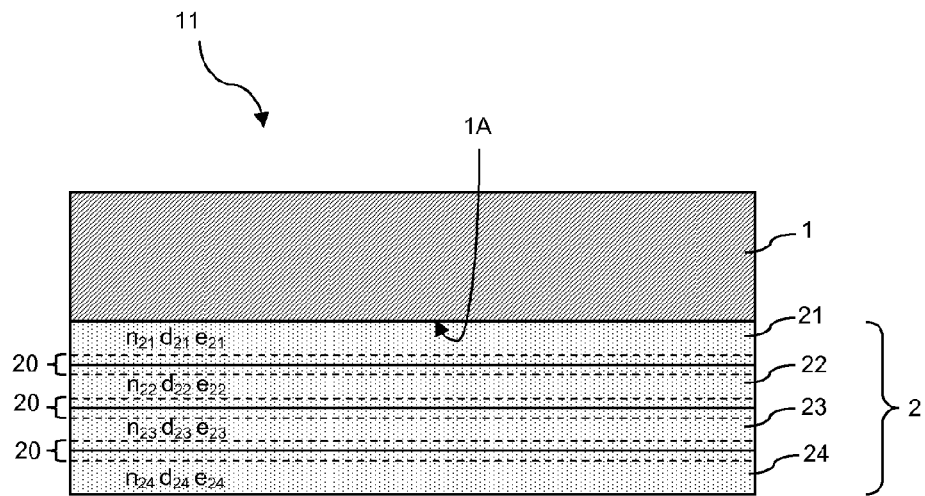
FIG. 3 is a larger-scale view of the protective substrate from FIGS. 1 and 2.

Moreover, as shown in FIG. 3, for each pair of successive thin layers of the barrier layer 2, the barrier layer comprises, at the interface between the two successive thin layers, a junction zone 20, having a geometric thickness between 10 nm and 30 nm, preferably between 10 nm and 20 nm, which has a density gradient between the density of a first layer and the density of the second layer of the pair of layers. In other words, each junction zone 20 has, from the lower density layer 22 or 24 to the higher density layer 21 or 23, a density gradient between the lower density $d_{22}=d_{24}$ and the higher density $d_{21}=d_{23}$. Due to the junction zones 20, there is a smooth transition, in terms of density, between the various successive thin layers of the constituent multilayer of the barrier layer 2. In particular, it may be considered that the variation of the density in the barrier layer 2 is a continuous periodic variation. This continuous variation of the density in the barrier layer limits the mechanical problems, for example of delamination, which would be capable of occurring in the presence of discontinuities or abrupt changes in density at the interface between the successive layers of the constituent multilayer of the barrier layer.

Advantageously, the barrier layer 2 makes it possible not only to protect the layer 5, but also to guarantee a good transmission of radiation to the photovoltaic cell 12. Specifically, from an optical point of view, the barrier layer 2 is optimized in order to act as an antireflection coating at the interface between the film 1 made of PET and the lamination interlayer 4 made of EVA. A loss of incident radiation on the module 50 occurs at this interface by reflection, due to the difference in refractive indices between the constituent materials of the film 1 and of the lamination interlayer 4. However, due to the alternately lower and higher refractive indices $n_{21}$, $n_{22}$, $n_{23}$, $n_{24}$ of the thin layers 21 to 24, and for suitable geometric thicknesses $e_{21}$, $e_{22}$, $e_{23}$, $e_{24}$ of these layers, the barrier layer 2 may constitute an interference filter and provide an antireflection function at the interface between the film 1 and the lamination interlayer 4. These suitable values of the geometric thicknesses of the layers of the constituent multilayer of the barrier layer 2 may especially be selected using optimization software.

By way of example, a multilayer of the barrier layer 2 optimized from an optical point of view successively comprises, from the face 1A of the PET film 1 to the EVA lamination interlayer 4:

a hydrogenated silicon nitride first layer 21 of relatively higher density $d_{21}$, having a refractive index $n_{21}$ of the order of 1.9 and a geometric thickness $e_{21}$ between 1 and 20 nm, preferably between 5 and 15 nm;

a hydrogenated silicon nitride second layer 22 of relatively lower density $d_{22}$, having a refractive index $n_{22}$ of the order of 1.7 and a geometric thickness $e_{22}$ between 25 and 45 nm, preferably between 30 and 40 nm;

a hydrogenated silicon nitride third layer 23 of relatively higher density $d_{23}=d_{21}$, having a refractive index $n_{23}=n_{21}$ of the order of 1.9 and a geometric thickness $e_{23}$ between 55 and 75 nm, preferably between 60 and 70 nm; and a hydrogenated silicon nitride fourth layer 24 of relatively lower density $d_{24}=d_{22}$, having a refractive index $n_{24}=n_{22}$ of the order of 1.7 and a geometric thickness $e_{24}$ between 65 and 85 nm, preferably between 75 and 85 nm.

This particular four-layer multilayer is the multilayer, optimized from an optical point of view, which has a minimum total geometric thickness, it being understood that other four-layer multilayers, optimized from an optical point of view, are also possible, with different thickness values of the individual thin layers and a total geometric thickness of the multilayer greater than that of the multilayer described above.

An evaluation of the performances of the optimized barrier layer 2 above as a moisture barrier results in a value of the moisture vapor transfer rate (or MVTR) of the layer 2 of less than $10^{-2}$ g/m² per day. Thus, the four-layer barrier layer 2 provides effective protection of the subjacent layers of the module 50 against moisture, in particular more effective than a single-layer barrier layer composed of hydrogenated silicon nitride $SiN_xH_y$ which would have a geometric thickness equal to the total geometric thickness of the barrier layer 2 and a constant stoichiometry over the entire thickness of the layer. This is because the succession of the layers 21 to 24 having alternate densities in the thickness of the barrier layer 2 interrupts the propagation of cracks within the layer 2. The diffusion paths and diffusion times of contaminants, such as water vapor and oxygen, are thus considerably extended.

Moreover, the reflection of solar radiation at the interface between the film 1, provided with the barrier layer 2 on its face 1A so as to form the protective substrate 11, and the lamination interlayer 4 is less than the reflection which would occur at the interface between a PET film and the lamination interlayer 4 in the absence of the barrier layer 2. This results in an improved transmission of the solar radiation to the absorber layer 6 through the protective substrate 11 according to the invention, and therefore an increased photovoltaic efficiency, or energy conversion efficiency, of the module 50 relative to the photovoltaic efficiency obtained in the absence of the barrier layer 2.

Figure 2:
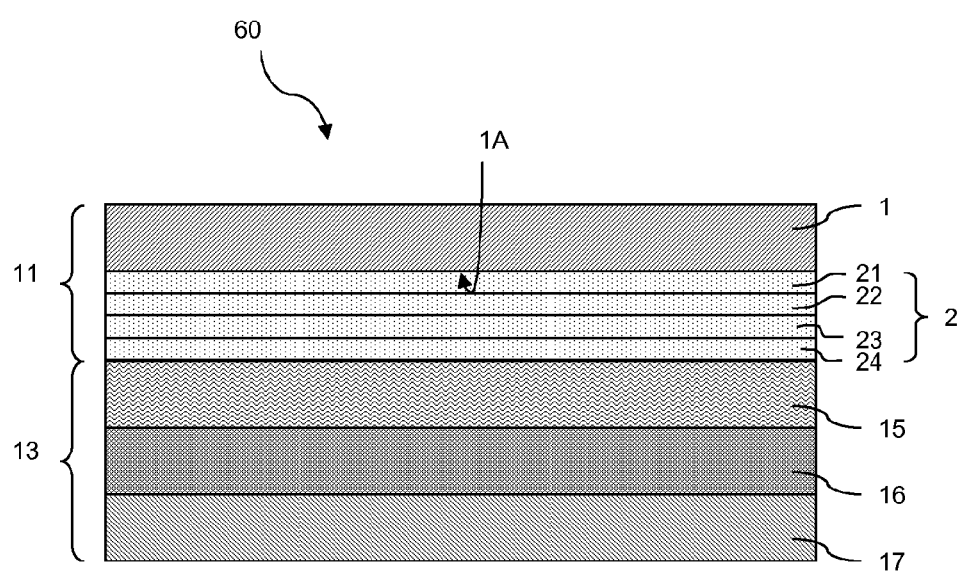
FIG. 2 is a section similar to FIG. 1 for an OLED device comprising the protective substrate from FIG. 1.

FIG. 2 illustrates the case where the protective substrate 11 shown in FIGS. 1 and 3 equips an organic light-emitting device or OLED device 60. In a known manner, the OLED device 60 successively comprises the protective substrate 11, a transparent first electrode 15, a multilayer 16 of organic light-emitting layers and a second electrode 17. The substrate 11 is the front substrate of the device 60, arranged on the side on which radiation is extracted from the device, the barrier layer 2 facing the inside of the device.

The first electrode 15 comprises a transparent electroconductive coating, for instance based on tin-doped indium oxide (ITO), or a silver-based multilayer. The multilayer stack of organic layers 16 comprises a central electroluminescent layer inserted between an electron transport layer and a hole transport layer, themselves inserted between an electron injection layer and a hole injection layer. The second electrode 17 is made of an electrically conductive material, in particular made of a metallic material of silver or aluminium type. As for the module 50, the barrier layer 2 of the substrate 11 provides both an effective protection of the subjacent layers 15, 16 and 17, by preventing the migration of contaminants to these layers, and an optimum radiation transmission from the multilayer stack of electroluminescent layers 16 to the outside of the device 60.

Figure 4:
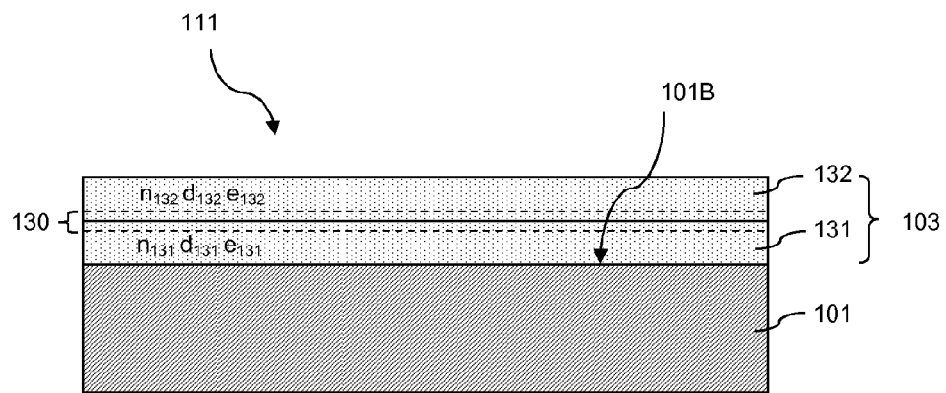
FIG. 4 is a view similar to FIG. 3 for a protective substrate conforming to a second exemplary embodiment of the invention.

In the second embodiment represented in FIG. 4, the elements analogous to those of the first embodiment bear identical references increased by 100. The protective substrate 111 conforming to this second embodiment is intended to equip a device that collects or emits radiation, for example a photovoltaic module or an OLED device. The protective substrate 111 comprises a film 101 made of PET, having a geometric thickness of 200 micrometers, and a barrier layer 103 on the face 101B of the film intended to be facing the other way from the element that collects or emits radiation. Thus, the substrate 111 is distinguished from the substrate 11 of the first embodiment in that the barrier layer is arranged on the face of the film 101 intended to be facing the other way from the element that collects or emits radiation, and not on the face of the film 101 intended to be facing the element that collects or emits radiation. Furthermore, the barrier layer 103 is a two-layer, and not four-layer, multilayer, which comprises two thin transparent layers 131, 132 of hydrogenated silicon nitride having both alternately lower and higher densities and alternately lower and higher refractive indices.

In a manner similar to the first embodiment, the difference between the density $d_{131}$ of the higher density layer 131 and the density $d_{132}$ of the lower density layer 132 is of the order of 10% of the density $d_{132}$ of the lower density layer 132, this difference in density being obtained by varying the stoichiometry between the two layers 131 and 132 of the same chemical nature $SiN_xH_y$. Furthermore, the barrier layer 103 comprises, at the interface between its two constituent thin layers, a junction zone 130 having a geometric thickness between 10 nm and 30 nm, preferably between 10 nm and 20 nm, which has, from the layer 131 to the layer 132, a density gradient between the density $d_{131}$ of the layer 131 and the density $d_{132}$ of the layer 132.

The multilayer of the barrier layer 103 is also designed with suitable geometric thicknesses $e_{131}$, $e_{132}$ and refractive indices $n_{131}$, $n_{132}$ of the layers 131 and 132 so that the barrier layer 103 provides an antireflection function at the interface between the PET film 101 and the air. The presence of the barrier layer 103 at this interface is even more effective for maximizing the transmission of radiation through the protective substrate 111, to or from the energy conversion elements of the device into which the substrate is integrated, that, due to a large difference in refractive indices between the constituent material of the film 101 and the air, the reflection at this interface is high.

By way of example, a two-layer multilayer of the barrier layer 103 that is optimized from an optical point of view, that is to say that makes it possible to obtain a maximum antireflection effect at the interface between the film 101 and the air, while having a minimum total geometric thickness, successively comprises, from the face 101B of the film 101:

a hydrogenated silicon nitride first layer 131 of relatively higher density $d_{131}$, having a refractive index $n_{131}$ of the order of 1.9 and a geometric thickness $e_{131}$ between 50 and 70 nm, preferably between 60 and 70 nm; and a hydrogenated silicon nitride second layer 132 of relatively lower density $d_{132}$, having a refractive index $n_{132}$ of the order of 1.7 and a geometric thickness $e_{132}$ between 60 and 80 nm, preferably between 70 and 80 nm.

As in the first embodiment, this two-layer barrier layer 103 provides an effective protection of the sensitive subjacent layers of a radiation-collecting or radiation-emitting device against contaminants, in particular more effective than a single-layer barrier layer composed of hydrogenated silicon nitride $SiN_xH_y$ having a constant stoichiometry over the entire thickness of the layer, which would have a geometric thickness equal to the total geometric thickness of the barrier layer 103. Furthermore, the barrier layer 103 makes it possible to obtain a reduction in the reflection of solar radiation at the interface between the protective substrate 111 and the air, relative to the reflection which would occur at the interface between a PET film and the air in the absence of the barrier layer. The benefit in terms of the reflection rate is around 3%. Thus, it is possible to improve the energy conversion efficiency of a radiation-collecting or radiation-emitting device by integrating thereinto the protective substrate 111 conforming to the invention.

According to another example of the invention, the two-layer barrier layer 103 may be a mixed multilayer, comprising an alternation between a thin layer of $SiN_xH_y$ type and a thin layer of $SiO_x$ type. The difference between the densities of the higher density $SiN_xH_y$ type layers and the density of the lower density $SiO_x$ type layers is of the order of 20% of the density of the $SiO_x$ type layers. Furthermore, the barrier layer comprises, at the interface between its two constituent thin layers, a junction zone having a geometric thickness between 10 nm and 20 nm, which has a density gradient between the density of a first layer and the density of the second layer of the barrier layer. In this case, an optimized multilayer of the mixed barrier layer, that is to say that makes it possible to obtain a maximum antireflection effect at the interface between the film 101 and the air, while having a minimum total geometric thickness of the barrier layer, successively comprises, from the face 101B of the film 101:

a hydrogenated silicon nitride $SiN_xH_y$ first layer of relatively higher density, having a refractive index of the order of 1.9 and a geometric thickness between 70 and 100 nm, preferably between 80 and 90 nm; and a silicon oxide $SiO_x$ second layer of relatively lower density, having a refractive index of the order of 1.9 and a geometric thickness between 60 and 90 nm, preferably between 70 and 80 nm.

The protective substrate comprising the PET film and the optimized mixed barrier layer above provides an effective protection of the sensitive subjacent layers against contaminants and a reduction in the reflection of solar radiation, at the interface between the PET film and the air, of greater than 4%.

Figure 5:
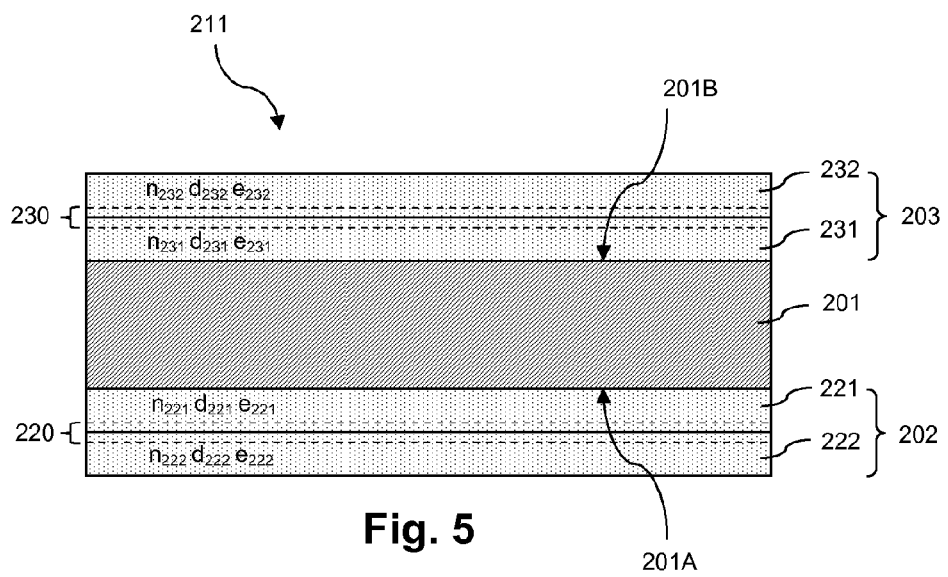
FIG. 5 is a view similar to FIG. 3 for a protective substrate conforming to a third exemplary embodiment of the invention.

In the third embodiment represented in FIG. 5, the elements analogous to those of the first embodiment bear identical references increased by 200. The protective substrate 211 conforming to this third embodiment is intended to equip a device that collects or emits radiation, for example a photovoltaic module or an OLED device. The protective substrate 211 comprises a film 201 made of PET, having a geometric thickness of 200 micrometers, and is distinguished from the substrates 11 and 111 of the preceding embodiments in that it comprises two two-layer barrier layers 202 and 203, deposited respectively on the face 201A of the film 201 intended to be facing the element that collects or emits radiation and on the face 201B of the film 201 intended to be facing the other way from the element that collects or emits radiation.

Each of the two barrier layers 202 and 203 is a multilayer stack of two thin transparent layers 221, 222 or 231, 232 of hydrogenated silicon nitride having both alternately lower and higher densities and alternately lower and higher refractive indices. As before, the difference between the density of the higher density layers and the density of the lower density layers, which is of the order of 10% of the density of the lower density layers, is obtained, for each barrier layer 202 and 203, by varying the stoichiometry between the two constituent layers of the barrier. Furthermore, each of the two barrier layers 202 and 203 comprises, at the interface between its two constituent thin layers, a junction zone 220 or 230 having a geometric thickness between 10 nm and 30 nm, preferably between 10 nm and 20 nm, which has a density gradient between the density of a first layer and the density of the second layer of the barrier layer.

The examples of two-layer multilayers given below are the multilayers of barrier layers 202 and 203 that make it possible to obtain a maximum antireflection effect at the interface between, respectively, the film 201 and an EVA lamination interlayer for the barrier layer 202, and the film 201 and the air for the barrier layer 203, while having minimum values of the total geometric thicknesses of the two barrier layers.

For the barrier layer 202 deposited on the face 201A of the film 201, the optimized multilayer of minimum geometric thickness successively comprises, from the face 201A of the film 201:
- a hydrogenated silicon nitride first layer 221 of relatively higher density $d_{221}$, having a refractive index $n_{221}$ of the order of 1.9 and a geometric thickness $e_{221}$ between 1 and 20 nm, preferably between 5 and 15 nm; and
- a hydrogenated silicon nitride second layer 222 of relatively lower density $d_{222}$, having a refractive index $n_{222}$ of the order of 1.7 and a geometric thickness $e_{222}$ between 100 and 130 nm, preferably between 110 and 125 nm.

For the barrier layer 203 deposited on the face 201B of the film 201, the optimized multilayer successively comprises, from the face 201B of the film 201:
- a hydrogenated silicon nitride first layer 231 of relatively higher density $d_{231}$, having a refractive index $n_{231}$ of the order of 1.9 and a geometric thickness $e_{231}$ between 60 and 80 nm, preferably between 60 and 70 nm; and
- a hydrogenated silicon nitride second layer 232 of relatively lower density $d_{232}$, having a refractive index $n_{232}$ of the order of 1.7 and a geometric thickness $e_{232}$ between 60 and 90 nm, preferably between 70 and 80 nm.

The protective substrate 211 having two barrier layers provides an effective protection of sensitive subjacent layers against contaminants and a minimization of the reflection of solar radiation both at the interface between the substrate 211 and the air and at the interface between the substrate 211 and the subjacent layer of a device into which the protective substrate 211 is integrated as a front substrate.

The preceding examples illustrate the advantages of a protective substrate according to the invention which, when it is integrated into a device that collects or emits radiation, gives this device an improved resistance with respect to degradations induced by exposure to air or to moisture, without a reduction in the energy conversion efficiency of the device, or even with an increase in this efficiency.

The invention is not limited to the examples described and represented. Generally, the aforementioned advantages in terms of protection with respect to environmental conditions and of improved transmission of radiation may be obtained by means of a protective substrate for which the or each barrier layer consists of an antireflection multilayer of at least two thin transparent layers having both alternately lower and higher refractive indices and alternately lower and higher densities.

In particular, the or each barrier layer of a protective substrate conforming to the invention may comprise any number, greater than or equal to two, of thin superposed layers, the chemical compositions and the thicknesses of these layers possibly being different from those described previously. Preferably, each thin layer of the constituent multilayer of the barrier layer is an oxide, nitride or oxynitride layer. For a given chemical composition of the thin layers of the barrier layer, the respective geometric thicknesses of the thin layers are advantageously selected, for example by means of optimization software, so as to maximize the transmission of radiation through the substrate, to or from the energy conversion elements of the device into which the substrate is integrated. A maximization of the transmission of radiation through the protective substrate is not however obligatory in order for this substrate to come under the field of the invention since, within the context of the invention, a multilayer is considered to have an antireflection function from the moment that it provides a transmission of radiation through the protective substrate, to or from the energy conversion elements, at least equal to the transmission of radiation obtained in the absence of the antireflection multilayer.

The alternation of refractive indices and of densities between the successive thin layers of the constituent multilayer of the or each barrier layer of a protective substrate conforming to the invention may be obtained, as illustrated in the preceding examples, by the superposition of thin layers having the same chemical nature but different stoichiometries. In this case, the chemical composition of each thin layer of the constituent multilayer of the barrier layer may be of the optionally hydrogenated, carbonated or doped $MO_x$, $MN_y$, or $MO_xN_y$ type, where M is a metal, for example chosen from Si, Al, Sn, Zn, Zr, Ti, Hf, Bi, Ta or mixtures thereof, and the values of x and y vary for each pair of successive thin layers of the multilayer. Examples of chemical compositions of a barrier layer for a protective substrate according to the invention, where the thin layers of the constituent multilayer of the barrier layer are of the same chemical nature but have different stoichiometries, especially include single oxides such as silicon oxide $SiO_x$ or aluminium oxide $AlO_x$, mixed oxides such as the mixed oxide of zinc and tin $Sn_xZn_yO_z$, generally non-stoichiometric and in the amorphous phase, nitrides such as silicon nitride $SiN_x$, oxynitrides such as silicon oxynitride $SiO_xN_y$, or else hydrogenated or carbonated forms of these oxides, nitrides or oxynitrides, such as $SiN_xH_y$, $SiO_xC_y$.

As a variant, the alternation of refractive indices and of densities between the successive thin layers of the constituent multilayer of the or each barrier layer of a protective substrate conforming to the invention may be obtained, for each pair of successive thin layers, by a change in the chemical nature between the two layers. They may thus be barrier layers whose multilayer comprises an alternation between, on the one hand, thin layers having a chemical composition of the optionally hydrogenated, carbonated or doped $MO_x$, $MN_y$ or $MO_xN_y$ type, where M is a metal, for example chosen from Si, Al, Sn, Zn, Zr, Ti, Hf, Bi, Ta or mixtures thereof, and, on the other hand, thin layers having a chemical composition of the optionally hydrogenated, carbonated or doped $M'O_x$, $M'N_y$ or $M'O_xN_y$ type, where M' is a metal different from the metal M, for example also chosen from Si, Al, Sn, Zn, Zr, Ti, Hf, Bi, Ta or mixtures thereof. Thus, as illustrated previously, the constituent multilayer of the or each barrier layer of a protective substrate conforming to the invention may involve an alternation between thin $SiN_xH_y$ layers of relatively higher refractive index and $SiO_x$ layers of relatively lower refractive index. As a variant and by way of example, it is also possible to envisage constituent multilayers of a barrier layer involving an alternation between thin $AlO_x$ or $SnZnO_x$ layers, of relatively higher refractive indices, and $SiO_xC_y$ layers, of relatively lower refractive indices. Another example is a constituent multilayer of a barrier layer involving an alternation between $SiO_2$ layers and SiOC layers. In this case involving $SiO_2$ layers and SiOC layers, the deposition process advantageously is atmospheric pressure PECVD.

It should be noted that, if in the preceding examples involving multilayers of hydrogenated silicon nitride layers, a high density is combined with a high refractive index and a low density with a low refractive index, the alternations of density and of refractive index may however be reversed. In particular, the barrier layer may comprise layers having a high density and a low refractive index alternated with layers having a low density and a high refractive index.

Moreover, a protective substrate according to the invention may comprise a polymer film composed of any transparent thermoplastic polymer having suitable properties. Examples of suitable thermoplastic polymers include, in particular, polyethylene terephthalate (PET), polyethylene naphthalate (PEN), polycarbonate, polyurethane, polymethyl methacrylate, polyamides, polyimides, or fluoropolymers such as ethylene tetrafluoroethylene (ETFE), polyvinylidene fluoride (PVDF), polychlorotrifluoroethylene (PCTFE), ethylene chlorotrifluoroethylene (ECTFE), fluorinated ethylene propylene copolymers (FEP). The polymer film of a protective substrate according to the invention may also be of any dimensions suitable for its role, in particular having a geometric thickness different from those described previously by way of examples.

A protective substrate according to the invention may also be used in any type of radiation-collecting or radiation-emitting device, without being limited to the photovoltaic and OLED devices that are described and represented. In particular, the invention may be applied for the encapsulation of thin-film photovoltaic modules whose absorber layer is a thin layer based on amorphous or microcrystalline silicon, or based on cadmium telluride, instead of a thin layer of a chalcopyrite compound, especially of CIS or CIGS type. Encapsulation of a module as used herein refers to covering at least part of the sensitive elements of the module so that the sensitive elements are not exposed to the environmental conditions. It may also be applied to the modules with organic photovoltaic cells, for which the organic absorber layer is particularly sensitive to environmental conditions, or else to the modules whose photovoltaic cells are made from polycrystalline or monocrystalline silicon wafers forming a p-n junction. A protective substrate according to the invention may also be applied to the modules with die-sensitized solar cells (DSSC), or Grätzel cells, for which an exposure to moisture may lead to a degradation of the electrodes and to a dysfunction of the electrolyte by producing interfering electrochemical reactions.

One preferred process for manufacturing a protective substrate conforming to the invention, comprising a thermoplastic polymer film and a multilayer barrier layer deposited on at least one face of the polymer film, comprises the deposition of the or each barrier layer on the polymer film by plasma-enhanced chemical vapor deposition (PECVD).

This reduced-pressure deposition technique uses the decomposition of precursors under the effect of a plasma, in particular under the effect of collisions between the excited or ionized species of the plasma and the molecules of the precursor. The plasma may, for example, be obtained by a radiofrequency discharge created between two planar electrodes (RF-PECVD), or using electromagnetic waves in the microwave range (MW-PECVD). The microwave PECVD technique using coaxial tubes to generate the plasma has the advantage of allowing the deposition onto a large-sized moving film, with particularly high deposition rates.

The PECVD technique is particularly advantageous for the manufacture of protective substrates conforming to the invention. Indeed, it makes it possible to very easily obtain a variation in the density and in the stoichiometry of a layer, via modification of quantities such as the pressure in the deposition chamber, the power, the relative proportions of the precursors, or combination thereof. An increase in the pressure in the deposition chamber generally favours the formation of less dense layers. It is thus possible to vary the pressure during the deposition in order to correlatively obtain a variation in the density. An increase in the power may lead to an increase in the density of the layer. Furthermore, a modification of the relative proportions of the precursors may result in a change in the stoichiometry of the constituent material of the layer, impacting the refractive index and/or the density of the layer. The PECVD technique may also make it possible to deposit successive thin layers of different, in particular alternate, chemical natures by modifying the nature of the precursors during the deposition. The introduction of different precursors during one phase of the deposition specifically makes it possible to obtain an area of different chemical nature within a layer, and therefore to form multilayer barrier layers, the thin constituent layers of which are of different chemical compositions.

According to a variant, it is possible to deposit the or each multilayer barrier layer on the polymer film by reactive sputtering, especially reactive magnetron sputtering. The reactive gas may be a standard gas such as $N_2$, $O_2$, or an organometallic precursor such as HMDSO. It is possible to obtain a variation in certain physicochemical characteristics of the multilayer barrier layer, especially in the density, the stoichiometry, the chemical composition, by modifying parameters such as the pressure in the deposition chamber, the power, the nature of the reactive gas, or combination thereof. An increase in the pressure, as in the case of PECVD, favors the formation of less dense layers.

Other deposition techniques are possible, especially evaporation techniques, or atmospheric pressure PECVD processes, in particular those using dielectric barrier discharge technologies.

By way of illustration, in the case of the protective substrate 11 conforming to the first embodiment, which comprises the PET film 1 and the hydrogenated silicon nitride four-layer barrier layer 2, the process for manufacturing the protective substrate by PECVD comprises steps as described below.

The PET film 1 is introduced into a chamber for deposition by RF-PECVD under reduced pressure. The face 1A of the film 1 is then activated by means of a plasma, especially an $O_2$ or $H_2$ plasma, in order to clean the face 1A of the film and to improve the adhesion of the barrier layer 2 to this face.

The precursors for the deposition of the barrier layer 2 of $SiN_xH_y$ type are an $SiH_4/NH_3$ mixture diluted in an $N_2/H_2$ mixture. This dilution allows a better stabilization of the plasma, while contributing to the physicochemical properties of the barrier layer obtained.

In the case of the deposition of a mixed barrier layer as described previously, the constituent multilayer of which comprises an alternation of thin $SiN_xH_y$ type layers with thin $SiO_x$ type layers, the precursors used for depositing the thin $SiO_x$ type layers may be, for example, an $SiH_4/N_2O$ mixture, or HMDSO, alone or as a mixture with oxygen. In this case, the precursors for depositing the thin $SiN_xH_y$ type layers, on the one hand, and the precursors for depositing the thin $SiO_x$ type layers, on the other hand, are introduced alternately into the deposition chamber.

The deposition is carried out in four successive steps. In a first step, the pressure in the chamber is set at 400 mTorr, the surface power density deposited by the plasma being 0.15 W/cm². In a second step, the pressure is gradually increased to 600 mTorr, the power being 0.10 W/cm². The third and fourth steps are identical, respectively, to the first and second steps.

In order to obtain the junction zones 20 having a density gradient, the plasma is not interrupted and the parameters of pressure and of power are modified continuously between the steps of depositing two successive thin layers of each pair of successive thin layers of the multilayer of the barrier layer 2. In other words, a continuously increasing pressure ramp and a continuously decreasing power ramp are applied, the duration of these ramps being adapted in order to obtain the desired geometric thickness of each junction zone 20.

The deposition of the barrier layer 2 on the film 1 is carried out at a temperature close to ambient temperature, below 100° C.

The hydrogenated silicon nitride barrier layer 2 of suitable thickness is thus obtained, it being possible to subdivide this barrier layer into four successive sublayers 21 to 24 that each correspond to one step of the deposition. The refractive index and the density are higher in the first and third layers 21 and 23 than in the second and fourth layers 22 and 24.

The manufacture of the protective substrates 111, 211 conforming to the second and third embodiments is carried out according to processes similar to that described above for the protective substrate 11, by deposition of the barrier layers 103, 202, 203 on the corresponding faces of the film 101 or 201.

The invention claimed is:

1. A protective substrate for a device comprising at least one element that collects or emits radiation, the substrate comprising a transparent polymer layer and a barrier layer on at least one face of the polymer layer, characterized in that the barrier layer consists of an antireflection multilayer of at least two thin transparent layers having both alternately lower and higher refractive indices and alternately lower and higher densities to provide a constituent multilayer, each thin layer of the constituent multilayer of the barrier layer being an oxide, nitride or oxynitride layer, wherein the two thin layers comprise a junction zone having a density gradient between the density of the two thin layers at an interface between the two thin layers, wherein the thickness of the junction zone is between 10 nm to 30 nm.

2. The substrate according to claim 1, characterized in that a difference between the density of a higher density layer and the density of a lower density layer of each pair of successive thin layers of the constituent multilayer of the barrier layer is greater than or equal to 10% of the density of the lower density layer.

3. The substrate according to claim 1, characterized in that a geometric thickness of each thin layer of the constituent multilayer of the barrier layer is adapted in order to maximize a transmission of radiation through the substrate to or from the element that collects or emits radiation.

4. The substrate according to claim 1, characterized in that the substrate comprises the barrier layer on the face of the polymer layer intended to be facing the element that collects or emits radiation and/or the barrier layer on the face of the polymer layer intended to be facing the other way from the element that collects or emits radiation.

5. The substrate according to claim 1, characterized in that, for each pair of successive thin layers of the constituent multilayer of the barrier layer, the two successive thin layers comprise the same chemical elements, the chemical elements of the two successive thin layers having different stoichiometries.

6. The substrate according to claim 5, characterized in that the constituent multilayer of the barrier layer comprises at least a superposition of a thin hydrogenated silicon nitride layer having a refractive index between 1.8 and 1.9 at 550 nm and of a thin hydrogenated silicon nitride layer having a refractive index between 1.7 and 1.8 at 550 nm.

7. The substrate according to claim 1, characterized in that, for each pair of successive thin layers of the constituent multilayer of the barrier layer, the two successive thin layers comprise different chemical elements to form two successive thin layers of different chemical compositions.

8. A device that collects or emits radiation comprising a protective substrate, the substrate comprising a transparent polymer layer and a barrier layer on at least one face of the polymer layer, characterized in that the barrier layer consists of an antireflection multilayer of at least two thin transparent layers having both alternately lower and higher refractive indices and alternately lower and higher densities to provide a constituent multilayer, each thin layer of the constituent multilayer of the barrier layer being an oxide, nitride or oxynitride layer, wherein the two thin layers comprise a junction zone having a density gradient between the density of the two thin layers at an interface between the two thin layers, wherein the thickness of the junction zone is between 10 nm to 30 nm; and at least one element that collects or emits radiation, the element being arranged relative to the substrate so as to be capable of collecting radiation that passes through the polymer layer and the barrier layer, or of emitting radiation through the polymer layer and the barrier layer.

9. The device according to claim 8, characterized in that the element that collects or emits radiation is a photovoltaic cell or an organic light-emitting diode.

10. A process for manufacturing a protective substrate for a device, the protective substrate comprising at least one element that collects or emits radiation, the substrate comprising a transparent polymer layer and a barrier layer on at least one face of the polymer layer, characterized in that the barrier layer consists of an antireflection multilayer of at least two thin transparent layers having both alternately lower and higher refractive indices and alternately lower and higher densities to provide a constituent multilayer, each thin layer of the constituent multilayer of the barrier layer being an oxide, nitride or oxynitride layer, wherein the two thin layers comprise a junction zone having a density gradient between the density of the two thin layers at an interface between the two thin layers, wherein the thickness of the junction zone is between 10 nm to 30 nm, wherein the process is characterized in that at least some of the thin layers of the constituent multilayer of the barrier layer are deposited by plasma-enhanced chemical vapor deposition (PECVD) and/or by sputtering.

11. The manufacturing process according to claim 10, characterized in that at least some of the thin layers of the constituent multilayer of the barrier layer are deposited by plasma-enhanced chemical vapor deposition (PECVD) by varying, during the deposition, the pressure in the deposition chamber and/or the power and/or the relative proportions of the precursors and/or the nature of the precursors.

12. The manufacturing process according to claim 10, characterized in that at least some of the thin layers of the constituent multilayer of the barrier layer are deposited by reactive sputtering by varying, during the deposition, the pressure in the deposition chamber and/or the power and/or the nature of the reactive gas.

13. The manufacturing process according to claim 10, characterized in that, prior to the deposition of the thin layers of the constituent multilayer of the barrier layer on one face of the polymer layer, said face of the polymer layer is activated by means of a plasma.

* * * * *